(12) United States Patent
Van Beuzekom et al.

(10) Patent No.: US 10,916,453 B2
(45) Date of Patent: Feb. 9, 2021

(54) LITHOGRAPHIC APPARATUS, METHOD OF TRANSFERRING A SUBSTRATE AND DEVICE MANUFACTURING METHOD

(71) Applicant: ASML NETHERLANDS B.V., Veldhoven (NL)

(72) Inventors: Aart Adrianus Van Beuzekom, Eindhoven (NL); Jozef Augustinus Maria Alberti, Nederweert (NL); Hubert Marie Segers, 's-Hertogenbosch (NL); Ronald Van Der Ham, Maarheeze (NL); Francis Fahrni, Eindhoven (NL); Ruud Olieslagers, Eindhoven (NL); Gerben Pieterse, Eindhoven (NL); Cornelius Maria Rops, Waalre (NL); Pepijn Van Den Eijnden, Veldhoven (NL); Paul Van Dongen, Eindhoven (NL); Bas Willems, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/564,969

(22) Filed: Sep. 9, 2019

(65) Prior Publication Data

US 2019/0391499 A1   Dec. 26, 2019

Related U.S. Application Data

(63) Continuation of application No. 15/317,386, filed as application No. PCT/EP2015/060427 on May 12, 2015, now Pat. No. 10,409,174.

(30) Foreign Application Priority Data

Jun. 16, 2014  (EP) .................................... 14172626
Jul. 25, 2014  (EP) .................................... 14178554
Dec. 18, 2014  (EP) .................................... 14198779

(51) Int. Cl.
| H01L 21/67 | (2006.01) |
|---|---|
| H01L 21/52 | (2006.01) |
| G03F 7/20 | (2006.01) |

(52) U.S. Cl.
CPC ...... *H01L 21/67034* (2013.01); *G03F 7/7075* (2013.01); *G03F 7/70341* (2013.01);
(Continued)

(58) Field of Classification Search
None
See application file for complete search history.

(56) References Cited

U.S. PATENT DOCUMENTS 5,874,820 A    2/1999  Lee
6,952,253 B2  10/2005  Lof et al.
(Continued)

FOREIGN PATENT DOCUMENTS

CN   1501439   6/2004
CN  100418185  6/2004
(Continued)

OTHER PUBLICATIONS

International Search Report and Written Opinion dated Sep. 8, 2015 in corresponding International Patent Application No. PCT/EP2015/060427.
(Continued)

*Primary Examiner* — Michelle M Iacoletti
(74) *Attorney, Agent, or Firm* — Pillsbury Winthrop Shaw Pittman, LLP

(57) ABSTRACT

A lithographic apparatus includes a substrate table, a post-exposure handling module, a substrate handling robot and a drying station. The substrate table is configured to support a substrate for an exposure process. The post-exposure han-
(Continued)

dling module is configured to handle the substrate post-exposure. The substrate handling robot is configured to transfer the substrate from the substrate table along a substrate unloading path into the post-exposure handling module. The drying station is configured to actively remove liquid from a surface of the substrate. The drying station is located in the substrate unloading path. The drying station is located in the post-exposure handling module. The post-exposure handling module may be a substrate handler.

20 Claims, 10 Drawing Sheets

(52) U.S. Cl.
CPC .......... *G03F 7/70991* (2013.01); *H01L 21/52* (2013.01); *H01L 21/6704* (2013.01); *H01L 21/67178* (2013.01); *H01L 21/67207* (2013.01); *H01L 21/67225* (2013.01)

(56) References Cited

U.S. PATENT DOCUMENTS

| | | | |
|---|---|---|---|
| 7,342,640 | B2 | 3/2008 | Kamono |
| 7,641,404 | B2 | 1/2010 | Hamada |
| 8,755,026 | B2 | 6/2014 | Gosen et al. |
| 2003/0012631 | A1 | 1/2003 | Pencis |
| 2004/0105936 | A1 | 6/2004 | Muraoka |
| 2004/0207824 | A1 | 10/2004 | Lof et al. |
| 2005/0259232 | A1 | 11/2005 | Streefkerk et al. |
| 2006/0033892 | A1 | 2/2006 | Cadee et al. |
| 2006/0048792 | A1 | 3/2006 | Nakamura et al. |
| 2006/0051709 | A1 | 3/2006 | Endo et al. |
| 2006/0061747 | A1 | 3/2006 | Ishii |
| 2006/0108068 | A1 | 5/2006 | Kaneyama et al. |
| 2006/0250602 | A1 | 11/2006 | Sato et al. |
| 2007/0064210 | A1 | 3/2007 | Kobayashi et al. |
| 2007/0131256 | A1 | 6/2007 | Nanba et al. |
| 2007/0166031 | A1 | 7/2007 | Hamada |
| 2007/0267047 | A1 | 11/2007 | Hori et al. |
| 2008/0016714 | A1 | 1/2008 | Kaneyama et al. |
| 2008/0053487 | A1 | 3/2008 | Goto et al. |
| 2008/0055574 | A1 | 3/2008 | Kamono |
| 2008/0192214 | A1 | 8/2008 | Leenders et al. |
| 2008/0314870 | A1 | 12/2008 | Inoue et al. |
| 2009/0009746 | A1 | 1/2009 | Auer-Jongepier et al. |
| 2009/0073394 | A1 | 3/2009 | Miyagi et al. |
| 2009/0074402 | A1 | 3/2009 | Miyagi |
| 2009/0081810 | A1 | 3/2009 | Hamada |
| 2010/0045949 | A1 | 2/2010 | Nakano et al. |

FOREIGN PATENT DOCUMENTS

| | | |
|---|---|---|
| CN | 1746774 | 3/2006 |
| CN | 1786827 | 6/2006 |
| EP | 1 420 298 | 5/2004 |
| JP | 2001-308003 | 11/2001 |
| JP | 2002-305140 | 10/2002 |
| JP | 2007-0027545 | 2/2007 |
| JP | 2007-109741 | 4/2007 |
| JP | 2008-066341 | 3/2008 |
| JP | 2009-094541 | 4/2009 |
| JP | 2009-105473 | 5/2009 |
| JP | 2009-170662 | 7/2009 |
| KR | 10-0540365 | 12/2005 |
| KR | 10-0760317 | 9/2007 |
| KR | 10-2009-0028421 | 3/2009 |
| TW | 200830054 | 7/2008 |
| TW | 200919574 | 5/2009 |
| TW | 200952045 | 12/2009 |
| TW | 201415173 | 4/2014 |

OTHER PUBLICATIONS

Taiwan Office Action dated Oct. 14, 2016 in corresponding Taiwan Patent Application No. 104118650.
Singapore Written Opinion dated Mar. 3, 2017 in corresponding Singapore Patent Application No. 11201609642Q.
First Office Action issued in related Chinese Patent Application No. 201580031670.2 dated Oct. 30, 2017 with English translation.
Taiwanese Office Action issued in corresponding Taiwanese Patent Application No. 106112185, dated Jun. 29, 2018.
English translation of Notification of Reasons for Refusal dated Jun. 1, 2018 issued in corresponding Korean Patent Application No. 10-2017-7001213.
Israeli Office Action issued in corresponding Israeli Patent Application No. 2016IL-0249047 dated Nov. 19, 2018.
Grant of Patent dated Nov. 9, 2018 issued in corresponding Korean Patent Application No. 10-2017-7001213 with English translation.
Japanese Office Action issued in corresponding Japanese Patent Application No. 2017-224512, dated Oct. 2, 2018.
Chinese Office Action issued in corresponding Chinese Patent Application No. 201580031670.2 dated Sep. 5, 2018.
Japanese Office Action issued in corresponding Japanese Patent Application No. 2017-224512 dated May 14, 2019.

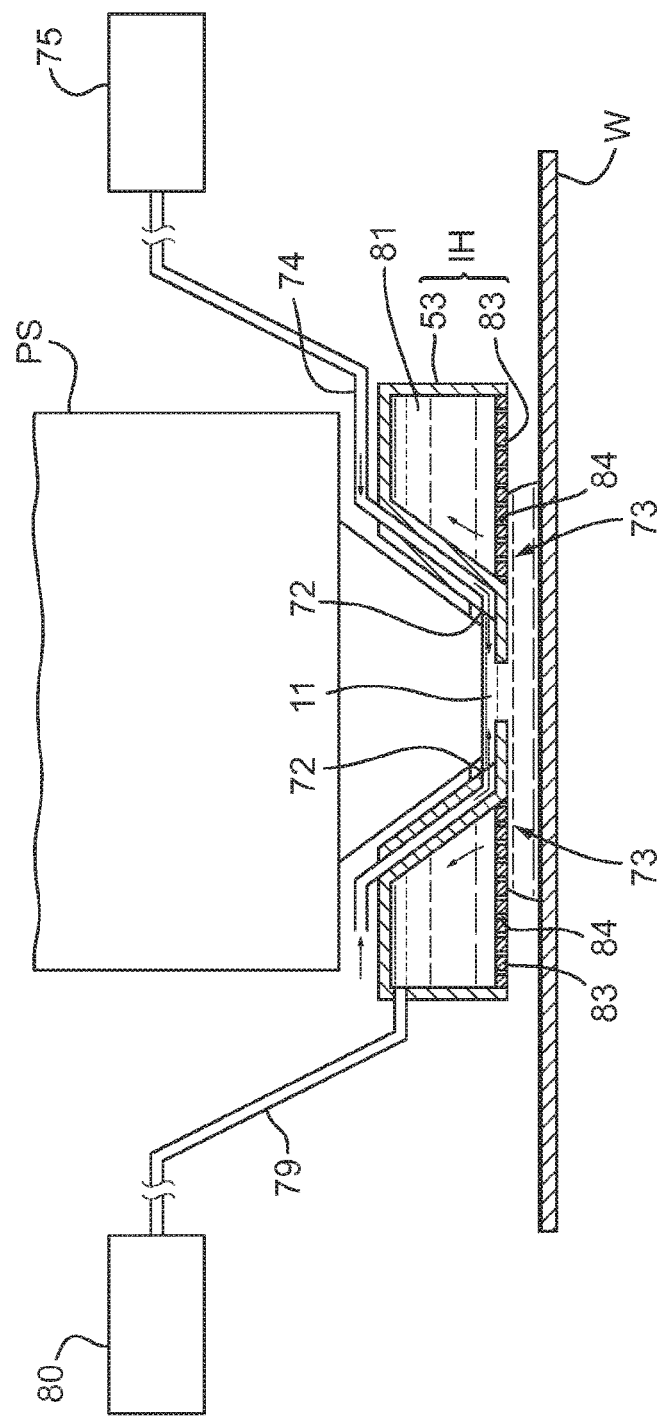

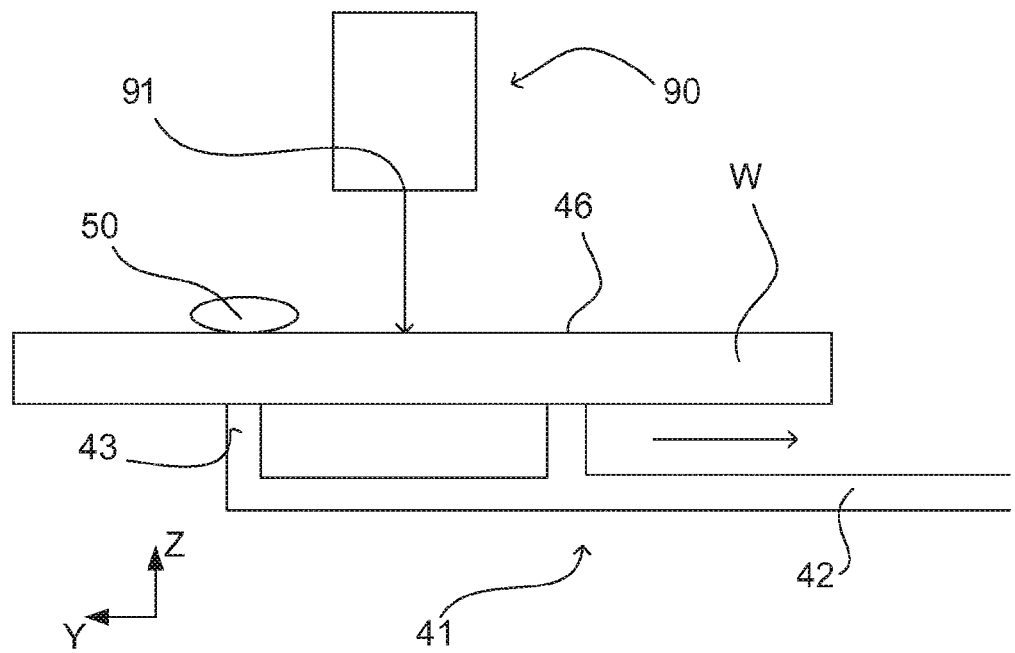
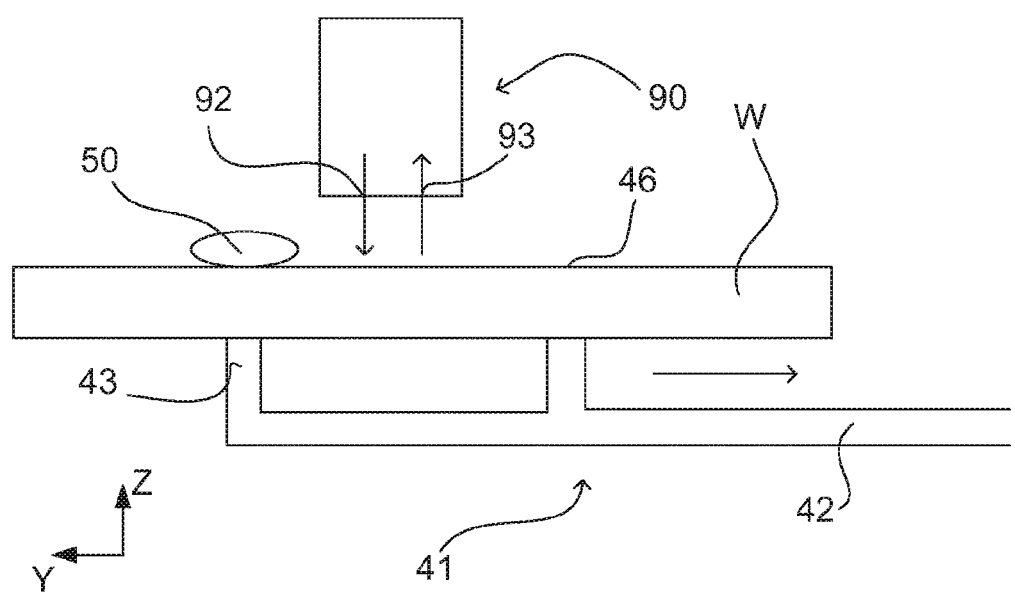

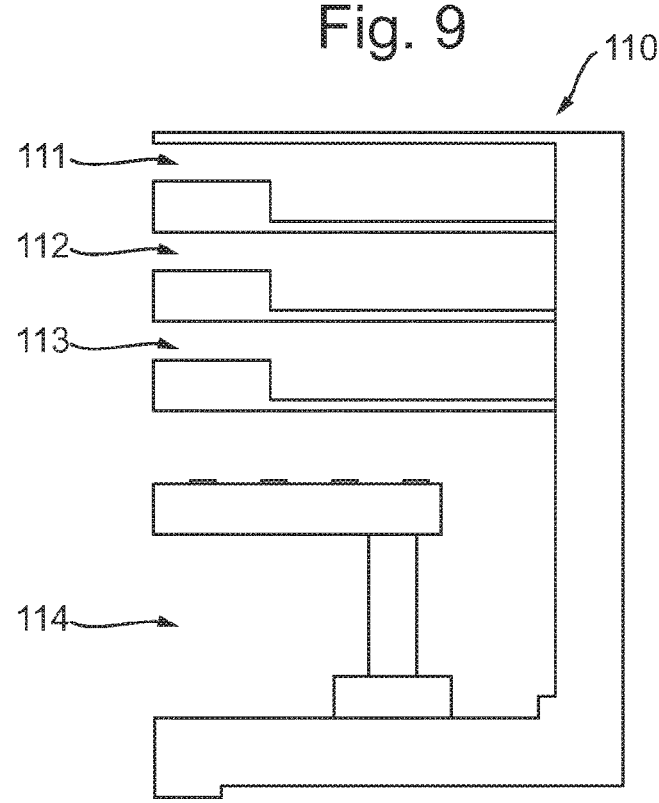
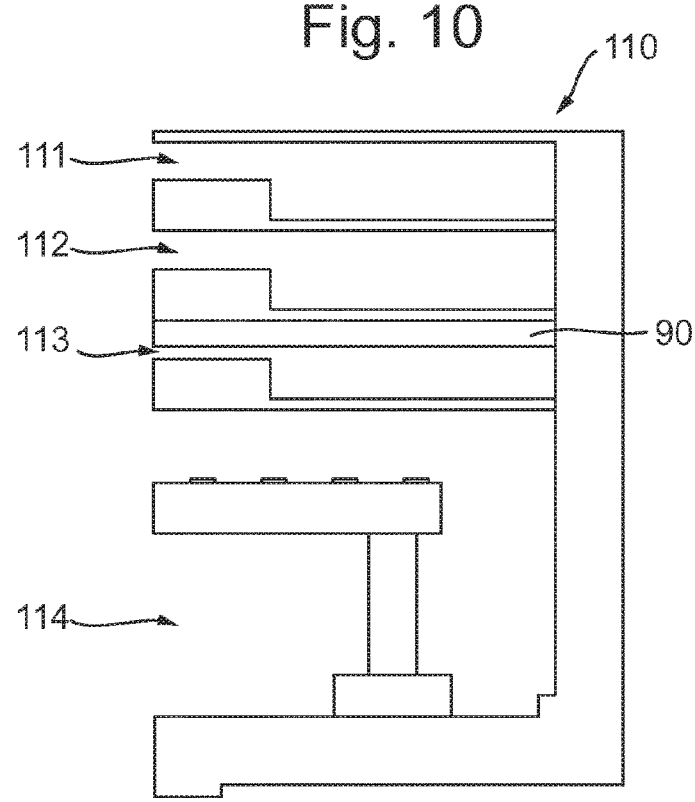

LITHOGRAPHIC APPARATUS, METHOD OF TRANSFERRING A SUBSTRATE AND DEVICE MANUFACTURING METHOD

This application is a continuation of U.S. patent application Ser. No. 15/317,386, filed on Dec. 8, 2016, now allowed, which is the U.S. national phase entry of PCT patent application no. PCT/EP2015/060427, filed on May 12, 2015, which claims the benefit of priority of European patent application no. 14172626.5, filed on Jun. 16, 2014, European patent application no. 14178554.3, filed on Jul. 25, 2014, and European patent application no. 14198779.2, filed on Dec. 18, 2014, each of the foregoing applications is incorporated herein in its entirety by reference.

FIELD

The present invention relates to a lithographic apparatus, a method of transferring a substrate and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs).

In immersion lithography, the liquid, e.g. water, can be left behind on the resist on the substrate after an exposure process. The liquid can cause the resist to deteriorate. The deterioration of the resist can result in defects where the liquid remains.

It is desirable to reduce defects caused by remaining liquid without adversely affecting the throughput of the lithographic apparatus.

SUMMARY

According to an aspect of the invention, there is provided a lithographic apparatus comprising a substrate table configured to support a substrate for an exposure process in which the substrate is exposed to a radiation beam to form a pattern via a liquid; a post-exposure handling module for handling the substrate post-exposure; a substrate handling robot configured to transfer the substrate from the substrate table along a substrate unloading path into the post-exposure handling module; and a drying station configured to actively remove liquid from a surface of the substrate; wherein the drying station is located in the substrate unloading path and in the post-exposure handling module such that the substrate can fully pass the drying station during transfer along the substrate unloading path.

According to an aspect of the invention, there is provided a method of transferring a substrate in a lithographic apparatus, the method comprising: supporting a substrate on a substrate table for an exposure process in which the substrate is exposed to a radiation beam to form a pattern via a liquid; transferring the substrate from the substrate table along a substrate unloading path into a post-exposure handling module for handling the substrate post-exposure; and by a drying station, actively removing liquid from a surface of the substrate; wherein the active removal of liquid is performed in the substrate unloading path and in the post-exposure handling module such that the substrate fully passes the drying station during transfer along the substrate unloading path.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 depicts part of a lithographic apparatus according to an embodiment of the invention;

FIGS. 4 and 5 depict part of a lithographic apparatus according to an embodiment of the invention;

FIGS. 9 to 14 depict part of a lithographic apparatus according to an embodiment of the invention.

DETAILED DESCRIPTION

Figure 1:
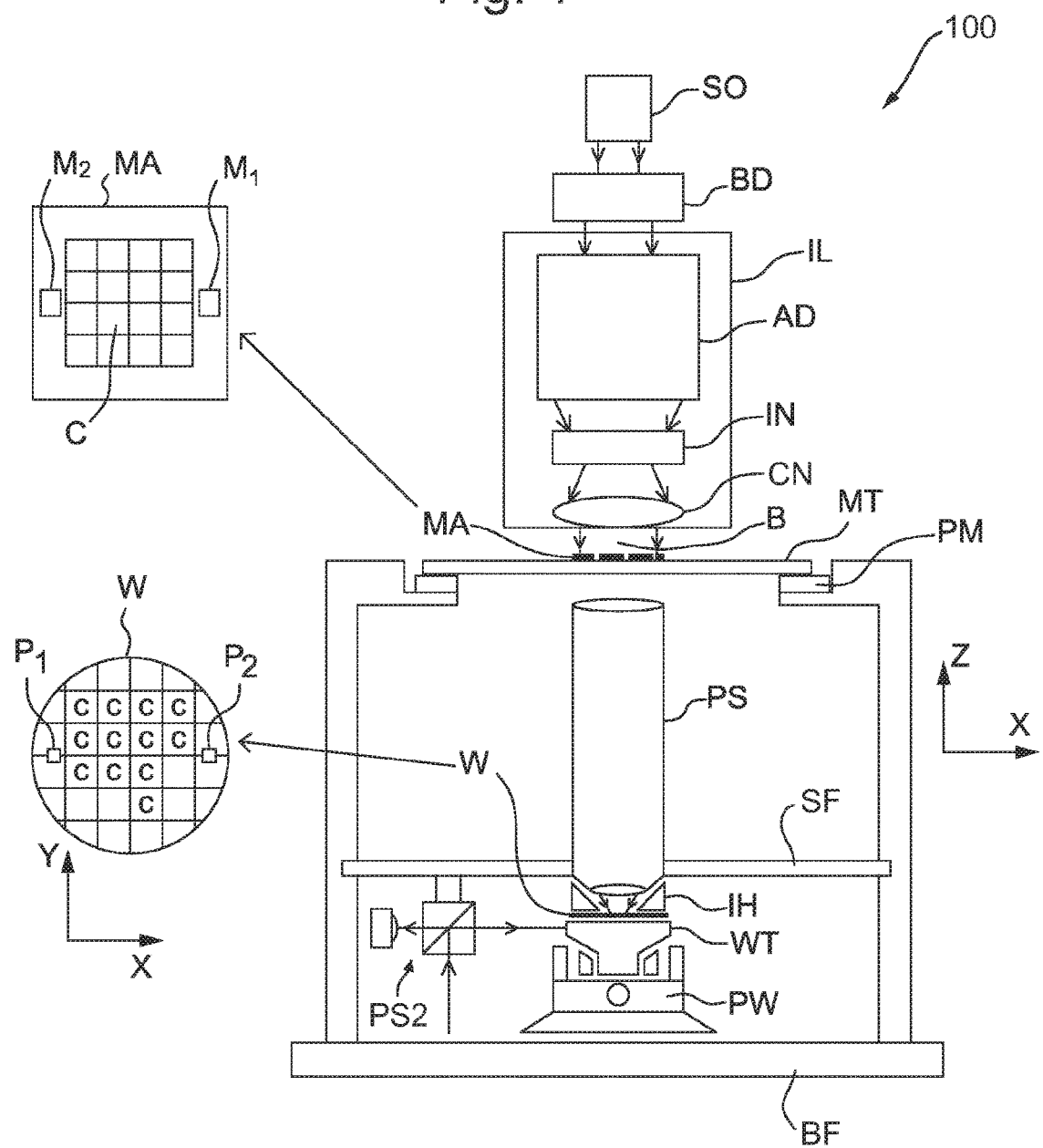
FIG. 1 depicts a lithographic apparatus according to an embodiment of the invention.

FIG. 1 schematically depicts a lithographic apparatus 100 according to an embodiment of the invention. The lithographic apparatus 100 includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device MA in accordance with certain parameters. The lithographic apparatus 100 also includes a substrate table (e.g. a wafer table) WT constructed to hold a substrate (e.g. a resist coated wafer) Wand connected to a second positioning device PW configured to accurately position the substrate W in accordance with certain parameters. The lithographic apparatus 100 further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The mask support structure MT supports, i.e. bears the weight of, the patterning device MA. The mask support structure MT holds the patterning device MA in a manner that depends on the orientation of the patterning device MA, the design of the lithographic apparatus 100, and other conditions, such as for example whether or not the patterning device MA is held in a vacuum environment. The mask support structure MT can use mechanical, vacuum, electrostatic or other clamping techniques to hold the patterning device. The mask support structure MT may be a frame or a table, for example, which may be fixed or movable as required. The mask support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart the radiation beam B with a pattern in its cross-section so as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Assist features may be placed on the patterning device MA to enable isolated and/or semi-isolated design features to be patterned as though they were more dense than they actually are. Generally, the pattern imparted to the radiation beam B will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The illumination system IL may include an adjuster AD configured to adjust the angular intensity distribution of the radiation beam B. Generally, at least the outer and/or inner radial extent (commonly referred to as σ-outer and σ-inner, respectively) of the intensity distribution in a pupil plane of the illumination system IL can be adjusted. In addition, the illumination system IL may include various other components, such as an integrator IN and a condenser CN. The illumination system IL may be used to condition the radiation beam B, to have a desired uniformity and intensity distribution in its cross section. The illumination system IL may or may not be considered to form part of the lithographic apparatus 100. For example, the illumination system IL may be an integral part of the lithographic apparatus 100 or may be a separate entity from the lithographic apparatus 100. In the latter case, the lithographic apparatus 100 may be configured to allow the illumination system IL to be mounted thereon. Optionally, the illumination system IL is detachable and may be separately provided (for example, by the lithographic apparatus manufacturer or another supplier).

As here depicted, the lithographic apparatus 100 is of a transmissive type (e.g. employing a transmissive mask). Alternatively, the lithographic apparatus 100 may be of a reflective type (e.g. employing a programmable mirror array of a type as referred to above, or employing a reflective mask).

The lithographic apparatus 100 may be of a type having two (dual stage) or more substrate tables WT (and/or two or more mask support structures MT, e.g. mask tables). In such a "multiple stage" lithographic apparatus 100 the additional substrate tables WT and/or mask support structures MT may be used in parallel, or preparatory steps may be carried out on one or more substrate tables WT and/or mask support structures MT while one or more other substrate tables WT and/or mask support structures MT are being used for exposure.

The patterning device MA is held on the mask support structure MT. The radiation beam B is incident on the patterning device MA. The radiation beam B is patterned by the patterning device MA. After being reflected from the patterning device MA, the radiation beam B passes through the projection system PS. The projection system PS focuses the radiation beam B onto a target portion C of the substrate W. The first positioner PM and a first position sensor (e.g., an interferometric device, linear encoder or capacitive sensor) can be used to accurately position the patterning device MA with respect to the path of the radiation beam B. The first position sensor is not explicitly shown in FIG. 1. With the aid of the second positioner PW and a second position sensor PS2 (e.g., an interferometric device, linear encoder or capacitive sensor), the substrate table WT can be moved accurately, e.g., so as to position different target portions C in the path of the radiation beam B.

In general, movement of the mask support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the mask support structure MT may be connected to a short-stroke actuator only, or may be fixed. The patterning device MA may be aligned using mask alignment marks $M_1$, $M_2$. The substrate W may be aligned using substrate alignment marks $P_1$, $P_2$. Although the substrate alignment marks $P_1$, $P_2$ as illustrated occupy dedicated target portions C, they may be located between target portions C (these are known as scribe-lane alignment marks). Similarly, in situations in which more than one die is provided on the patterning device MA, the mask alignment marks $M_1$, $M_2$ may be located between the dies.

Immersion techniques can be used to increase the numerical aperture NA of the projection system PS. As depicted in FIG. 1, in an embodiment the lithographic apparatus 100 is of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus 100, for example, between the patterning device MA and the projection system PS. The term "immersion" as used herein does not mean that a structure, such as the substrate W, must be submerged in liquid, but rather only means that a liquid is located between the projection system PS and the substrate W during exposure.

Referring to FIG. 1, the illuminator IL receives a radiation beam from a source module SO. The source module SO and the lithographic apparatus 100 may be separate entities, for example when the source module SO is an excimer laser. In such cases, the source module SO is not considered to form part of the lithographic apparatus 100 and radiation is passed from the source module SO to the illumination system IL with the aid of a beam delivery system BD. In an embodiment the beam delivery system BD includes, for example, suitable directing mirrors and/or a beam expander. In other cases the source module SO may be an integral part of the lithographic apparatus 100, for example when the source module SO is a mercury lamp. The source module SO and the illumination system IL, together with the beam delivery system BD if required, may be referred to as a radiation system.

Arrangements for providing liquid between a final element of the projection system PS and the substrate W can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

Figure 2:
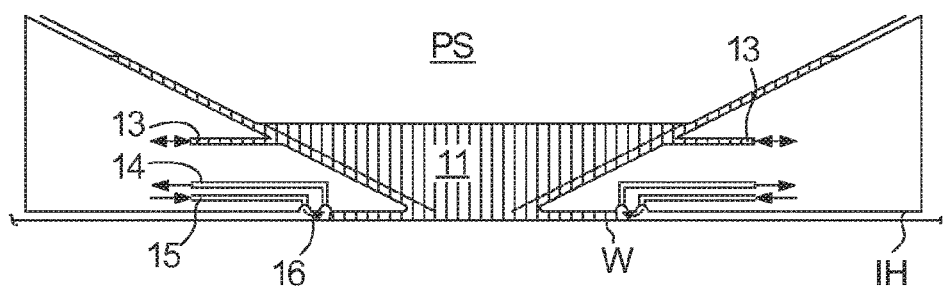
FIG. 2 depicts part of a lithographic apparatus according to an embodiment of the invention.

As depicted in FIG. 1 the liquid supply system is provided with a liquid confinement structure IH which extends along at least a part of a boundary of the space between the final element of the projection system PS and the substrate W, substrate table WT or both. Such an arrangement is illustrated in FIG. 2. The arrangement illustrated in FIG. 2 and described below may be applied to the lithographic apparatus described above and illustrated in FIG. 1.

FIG. 2 schematically depicts a localized liquid supply system or fluid handling system with a liquid confinement structure IH, which extends along at least a part of a boundary of the space 11 between the final element of the projection system PS and the substrate table WT or substrate W. (Please note that reference in the following text to the surface of the substrate W also refers in addition or in the alternative to a surface of the substrate table WT, unless expressly stated otherwise.) In an embodiment, a seal is formed between the liquid confinement structure IH and the surface of the substrate W. The seal may be a contactless seal such as a gas seal 16 (such a system with a gas seal is disclosed in European patent application publication no. EP-A-1,420,298) or a liquid seal.

The liquid confinement structure IH at least partly contains liquid in the space 11 between the final element of the projection system PS and the substrate W. The space 11 is at least partly formed by the liquid confinement structure IH positioned below and surrounding the final element of the projection system PS. Liquid is brought into the space 11 below the projection system PS and within the liquid confinement structure IH by a liquid inlet/outlet 13. The liquid may be removed by a liquid inlet/outlet 13. In an embodiment one of two liquid inlet/outlets 13 supplies the liquid while the other liquid inlet/outlet 13 removes the liquid depending on the scanning direction.

The liquid may be contained in the space 11 by the gas seal 16. During use, the gas seal 16 is formed between the bottom of the liquid confinement structure IH and the surface of the substrate W. The gas in the gas seal 16 is provided under pressure via an inlet 15 to the gap between the liquid confinement structure IH and substrate W. The gas is extracted via an outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure IH and the substrate W contains the liquid in the space 11. Such a system is disclosed in United States patent application publication no. US 2004-0207824, which is hereby incorporated by reference in its entirety. In an embodiment, the liquid confinement structure IH does not have a gas seal.

In a localized area liquid supply system, the substrate W is moved under the projection system PS and the liquid supply system. When an edge of the substrate W is to be imaged, an edge of the substrate W (or other object) will pass under the space 11. When a sensor on the substrate table WT (or on a measurement table) is to be imaged, an edge of the substrate W (or other object) will pass under the space 11. A dummy substrate or so-called closing plate can be positioned under the liquid supply system to enable, for example, substrate swap to take place. When the substrate table WT is to be moved such that a dummy substrate or so-called closing plate can be positioned under the liquid supply system, an edge of the substrate W (or other object) will pass under the space 11. Liquid may leak into the gap between the substrate W and substrate table WT. This liquid may be forced under hydrostatic or hydrodynamic pressure or the force of a gas knife or other gas flow creating device.

FIG. 3 is a side cross sectional view that depicts a further liquid supply system or fluid handling system according to an embodiment. The arrangement illustrated in FIG. 3 and described below may be applied to the lithographic apparatus 100 described above and illustrated in FIG. 1. The liquid supply system is provided with a liquid confinement structure IH, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.)

The liquid confinement structure IH at least partly contains liquid in the space 11 between the final element of the projection system PS and the substrate W. The space 11 is at least partly formed by the liquid confinement structure IH positioned below and surrounding the final element of the projection system PS. In an embodiment, the liquid confinement structure IH comprises a main body member 53 and a porous member 83. The porous member 83 is plate shaped and has a plurality of holes (i.e., openings or pores). In an embodiment, the porous member 83 is a mesh plate wherein numerous small holes 84 are formed in a mesh. Such a system is disclosed in United States patent application publication no. US 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid LQ recovered via the recovery port 73 through the passageway 79. The porous member 83 is disposed in the recovery port 73.

In an embodiment, to form the space 11 with the liquid between the projection system PS and the liquid confinement structure IH on one side and the substrate W on the other side, liquid is supplied from the supply ports 72 to the space 11 and the pressure in a recovery chamber 81 in the liquid confinement structure IH is adjusted to a negative pressure so as to recover the liquid via the holes 84 (i.e., the recovery port 73) of the porous member 83. Performing the liquid supply operation using the supply ports 72 and the liquid recovery operation using the porous member 83 forms the space 11 between the projection system PS and the liquid confinement structure IH on one side and the substrate W on the other side.

In use of the lithographic apparatus 100, a substrate W undergoes different lithography steps and process steps. A substrate W may be cleaned, for example by a wet chemical treatment. The substrate W may be heated to a temperature sufficient to drive off any moisture that may be present on the surface of the substrate W. The substrate W may be covered with a layer of resist (e.g. photoresist). The substrate W may be prebaked to drive off excess photoresist solvent. The substrate W is then exposed so that a pattern in the radiation beam B is transferred onto the substrate W. The substrate W may then undergo developing, etching and removal of the resist. These steps may be repeated for a further layer on the substrate W.

As depicted in FIG. 1, in an embodiment the lithographic apparatus 100 comprises a substrate table WT. The substrate table WT is configured to support a substrate W for an exposure process. In an exposure process, the substrate W is exposed to a radiation beam B to form a pattern on the substrate W via a liquid (i.e. immersion liquid). In an embodiment a method of transferring the substrate W in the lithographic apparatus 100 is provided. The method comprises supporting the substrate W on a substrate table WT for an exposure process. In an exposure process, a pattern in the radiation beam B is transferred onto the substrate W.

Some of the liquid, e.g. water, is left behind on the resist on the substrate W after an exposure process. The liquid can cause the resist to deteriorate. The deterioration of the resist can result in defects where the liquid remains. Multiple layers may be formed on each substrate W. Even if the probability of a defect occurring in a single layer is small, if the number of layers is large then the total probability of a defect occurring can be significant.

Figure 6:
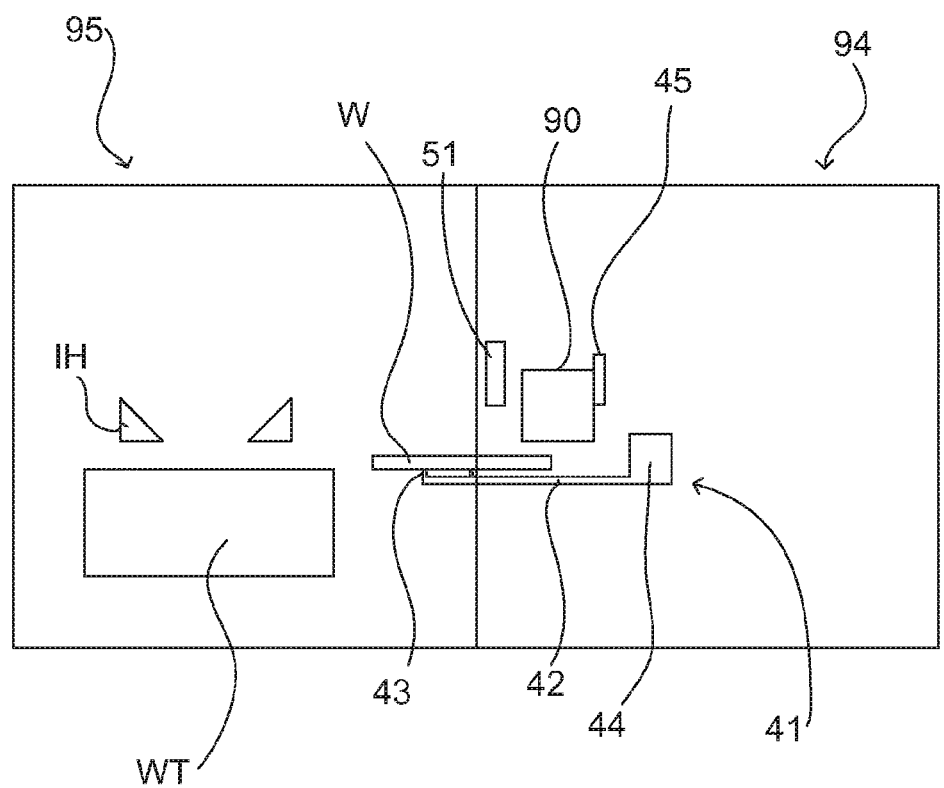
FIGS. 6 to 8 schematically depict a lithographic apparatus according to an embodiment of the invention.

In an embodiment the lithographic apparatus 100 comprises a post-exposure handling module 94 (depicted in FIG. 6). The post-exposure handling module is for handling the substrate W post-exposure. After the exposure process the substrate W is handled by the post-exposure handling module 94. For example, in an embodiment the post-exposure handling module 94 comprises at least one substrate handler sensor 51 (which may also be called a wafer handler sensor). The at least one substrate handler sensor 51 is configured to measure a parameter (e.g. location of a holder 43, tilt of the holder 43) associated with a substrate handling robot 41. In an embodiment the at least one substrate handler sensor 51 is mounted on a sensor frame SF (depicted in FIG. 1). The sensor frame SF may be called a metrology frame. Alternatively, in an embodiment the at least one substrate handler sensor 51 is mounted on a base frame BF (depicted in FIG. 1) of the lithographic apparatus 100. In an embodiment, the liquid confinement structure IH is attached to the sensor frame SF. In an embodiment the projection system PS is attached to the sensor frame SF. In an embodiment the substrate table WT is attached to the base frame BF. In an embodiment the sensor frame SF is dynamically isolated from the base frame BF. In an embodiment the at least one substrate handler sensor 51 is used to check if the location and tilt of the holder 43 of the substrate handling robot 41 are within fixed tolerances during substrate exchange.

In an embodiment the at least one substrate handler sensor 51 comprises one or more (e.g. two) optical sensors. The optical sensors are configured to measure a tilt of the holder 43 around the Y-axis. In an embodiment the at least one substrate handler sensor 51 comprises one or more (e.g. three) other sensors. In an embodiment the other sensors of the at least one substrate handler sensor 51 are capacitive. The other sensors of the at least one substrate handler sensor 51 are configured to measure the location of the holder 43 in the XY-plane.

In an embodiment the lithographic apparatus 100 comprises two substrate handling robots 41. In an embodiment the lithographic apparatus 100 comprises two substrate handler sensors 51 associated to each substrate handling robot 41. Each substrate handling robot 41 has an associated pair of substrate handler sensors 51.

FIG. 4 depicts schematically part of a lithographic apparatus 100 according to an embodiment. In an embodiment the lithographic apparatus 100 comprises the substrate handling robot 41. The substrate handling robot 41 is configured to transfer the substrate W from the substrate table WT along a substrate unloading path into the post-exposure handling module 94. In an embodiment the method of transferring the substrate W comprises transferring the substrate W from the substrate table WT along the substrate unloading path into the post-exposure handling module 94 for handling the substrate W post-exposure.

As depicted in FIG. 4, in an embodiment the substrate handling robot 41 comprises a robot arm 42 (or substrate handling arm). In an embodiment the substrate handling robot 41 comprises a positioner part 44 (depicted in FIG. 6) and the holder 43. The positioner part 44 interfaces with the holder 43. For example the positioner part 44 may interface with the holder 43 via the robot arm 42. In an embodiment the robot arm 42 is driven by actuators of the positioner part 44 and is used to transfer the substrate W between the substrate table WT and an unloading dock in the post-exposure handling module 94.

In an embodiment the holder 43 comprises a pair of prongs spaced apart in a substantially horizontal plane. In an embodiment an upper surface, or part thereof, of each of the prongs may be provided with an area having burls formed by laser sintering. The use of burls enables the use of a vacuum and electrostatic clamping techniques and prevents particulates distorting the substrate W.

In an embodiment the lithographic apparatus 100 comprises a drying station 90. The drying station 90 is configured to actively remove liquid from a surface 46 of the substrate W. For example, a droplet 50 of immersion liquid may be present at the surface 46 of the substrate W. The drying station 90 is configured to actively remove the droplet 50 from the surface 46 of the substrate W. The drying station 90 is configured to actively remove liquid films from the surface 46 of the substrate W.

In an embodiment the drying station 90 is located in the substrate unloading path. In particular, the drying station 90 is located in the substrate unloading path such that the substrate W can fully pass the drying station 90 during transfer along the substrate unloading path. The substrate W can be dried in the substrate unloading path. An embodiment of the invention is expected to achieve drying of the substrate W without deviating the substrate W from the substrate unloading path between the substrate table WT and the post-exposure handling module 94.

By providing that the substrate W can fully pass the drying station 90 during transfer along the substrate unloading path, it is not necessary for a specific location (e.g. a holding table) to be provided for the drying to take place. Providing that the substrate W can fully pass the drying station 90 means that there is sufficient space in the substrate unloading path beyond the drying station 90 to fit the substrate W. It is not the case that the substrate W partially passes under the drying station 90, with subsequent relative motion (e.g. rotation of the substrate W) between the substrate W and the drying station 90 allowing the surface 46 of the substrate W to be dried. Instead, the substrate W fully passes the drying station 90 such that the substrate W can be dried during the course of the substrate W being transferred along the substrate unloading path.

In an embodiment the drying station 90 is located in the post-exposure handling module 94. The substrate unloading path extends from an edge of the substrate table WT to a location within the post-exposure handling module 94. Part of the substrate unloading path is within the post-exposure handling module 94. In an embodiment the drying station 90 is located in the part of the substrate unloading path that is within the post-exposure handling module 94. The active removal of liquid is performed in the substrate unloading path and in the post-exposure handling module 94.

In an embodiment the post-exposure handling module 94 is a substrate handler (which may also be called a wafer handler). The type of drying station 90 is not particularly limited. By providing that the drying station 90 is located in the substrate handler, an embodiment of the invention is expected to achieve an improved throughput of exposed substrates W. In an embodiment the drying station 90 is configured so as to maintain throughput, for example by being located in the substrate handler.

The drying station 90 may be called a wafer dryer. In an embodiment the drying station 90 is in the substrate handler near where the substrate W exits the substrate table WT (e.g. wafer table). In an embodiment the drying station 90 is just inside the substrate handler, near where the substrate W exits the substrate table WT.

In an embodiment the drying station 90 comprises one or more of a gas knife 91, a water bath and a continuous flow of liquid. FIG. 4 depicts a drying station 90 that comprises a gas knife 91.

FIG. 5 depicts a drying station 90 that comprises a continuous flow of liquid (which may be called a waterline). As depicted in FIG. 5, in an embodiment the drying station 90 comprises a flow supply opening 92 and a flow extraction opening 93. The flow supply opening 92 is configured to supply a flow of liquid, e.g. water, to the space between the drying station 90 and the surface 46 of the substrate W. The flow extraction opening 93 is configured to extract the liquid, e.g. water, from the space between the drying station 90 and the surface 46 of the substrate W.

The flow supply opening 92 and the flow extraction opening 93 are configured to provide a continuous flow of liquid to the space between the drying station 90 and the surface 46 of the substrate W. The continuous flow of liquid may be called a waterline or a water bath. The flow of liquid in contact with the surface 46 of the substrate W is larger than the droplet 50. When the flow of liquid comes into contact with the droplet 50, the droplet 50 becomes part of the flow of liquid. By surface tension, the droplet 50 is actively removed from the surface 46 of the substrate W.

In an embodiment the drying station 90 comprises a liquid extractor (which may be called a single phase extractor) which extracts only liquid from the surface 46 of the substrate W. Alternatively, in an embodiment the drying station 90 comprises a two phase extractor which extracts both liquid and gas from the surface 46 of the substrate W.

When the drying station 90 comprises a liquid bath, the liquid bath may be provided by an arrangement similar to the arrangement of a liquid confinement structure IH as described above. In use, liquid (such as water) is supplied to the substrate W such that a gap between the substrate W and a liquid extractor of the drying station 90 is filled with water. Water is continued to be provided during the drying process to ensure that the gap between the substrate W and the liquid extractor is always filled with water. The water that fills the gap may be called a water bath. The liquid to be removed from the substrate and the water supplied by the drying station 90 become a single body of liquid (i.e. the water bath). The liquid extractor extracts the water from the gap between the substrate W and the drying station 90. The water bath allows the liquid extractor to extract liquid which has a thickness which is not thick enough to span the gap between the substrate W and the liquid extractor on its own. The use of the water bath helps ensure that the gap between the substrate W and the liquid extractor is filled even if the thickness of liquid to be removed from the surface 46 of the substrate W is not high enough to reach the liquid extractor.

In an embodiment the drying station 90 comprises a gas knife that removes liquid from the surface 46 of the substrate W.

In an embodiment the drying station comprises a heater configured to heat the surface 46 of the substrate W. Liquid on the surface 46 of the substrate W is heated up and evaporates from the surface 46 of the substrate W.

Figure 13:
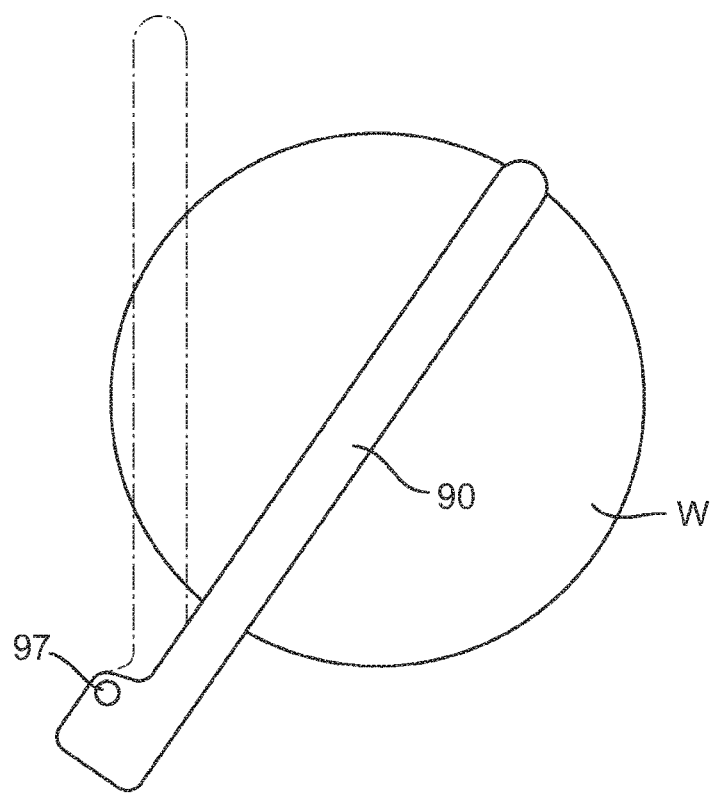

In an embodiment the drying station 90 has a form of a drying station arm and a rotator. The drying station arm is configured to actively remove liquid from the surface 46 of the substrate W. The rotator is configured to rotate the drying station arm through a rotation plane parallel to the surface 46 of the substrate W. The drying station arm and rotator are shown in FIGS. 11 and 13, and are described in further detail below.

Figure 11:
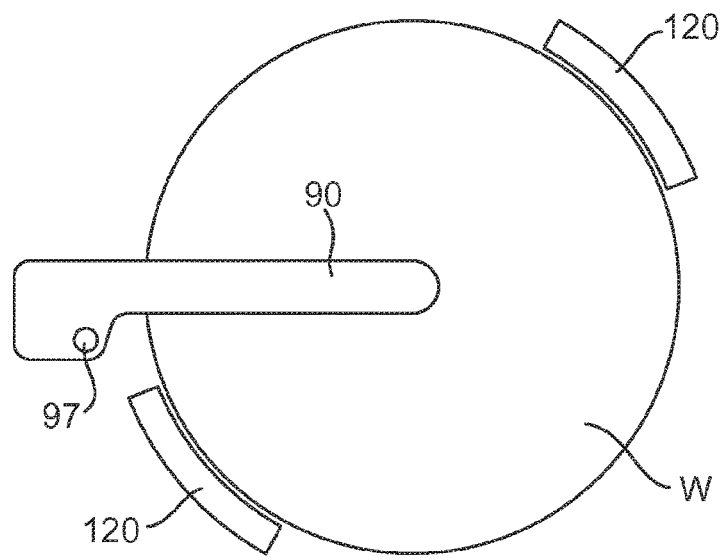

In an embodiment the lithographic apparatus 100 comprises a substrate turntable 120 configured to rotate the substrate W, as shown in FIG. 11. In an embodiment the drying station 90 has a form of a drying station arm that extends over a radius of the substrate turntable 120 such that the drying station arm is configured to actively remove liquid from the surface 46 of the substrate W when the substrate W is rotated on the substrate turntable 120.

In an embodiment the substrate unloading path is substantially straight. By providing that the substrate unloading path is substantially straight, a straight line movement of the substrate handling robot 41 along the substrate unloading path results in the substrate W passing the drying station 90. The drying station 90 actively removes liquid from the surface of the substrate W. The substrate W can be moved directly from the substrate table WT into the substrate handling module 94. The substrate W can be dried during the direct movement. No time is wasted moving the substrate W to or from the drying station 90. When the substrate W is transferred in a straight line along the substrate unloading path, the substrate W passes the drying station 90 such that the drying station 90 actively removes liquid from the surface 46 of the substrate W. An embodiment of the invention is expected to achieve increased throughput.

However, it is not necessary for the substrate unloading path to be substantially straight. In an embodiment the substrate unloading path is curved. By providing that the substrate unloading path is curved, the layout of other components within the lithographic apparatus 100 is less restricted.

As mentioned above and depicted in FIG. 6, in an embodiment the substrate handling robot 41 comprises a positioner part 44 and the holder 43 that interfaces with the positioner part 44. The holder 43 is configured to hold the substrate W. In an embodiment the holder 43 comprises a gripper configured to grip the substrate W. For example, the gripper may grip edges of the substrate W. In an alternative embodiment the holder 43 comprises a clamp configured to clamp the substrate W. For example, the clamp may clamp the substrate W from beneath. The clamp may comprise vacuum pads or may be an electrostatic clamp. The positioner part 44 may be called a wrist of the substrate handling robot 41. The positioner part 44 is configured to move between a robot unload position and a robot handling position. In the robot unload position the holder 43 holds the substrate W on the substrate table WT. In the robot handling position the holder 43 holds the substrate W in the post-exposure handling module 94. In FIG. 4 and FIG. 5, the positioner part 44 (not shown in FIG. 4 or FIG. 5) is at a location between the robot unload position and the robot handling position.

After exposure of the substrate W, the positioner part 44 is at the robot unload position and the holder 43 holds the substrate W. The substrate W is removed from the substrate table WT. The positioner part 44 moves from the robot unload position to the robot handling position. In an embodiment the positioner part 44 moves along the substrate unloading path. In an embodiment the robot handling position is within the post-exposure handling module 94.

The edge of the substrate table WT is at an upstream end of the substrate unloading path. A downstream end of the substrate unloading path is within the post-exposure handling module 94. In an embodiment the drying station 90 is located in the substrate unloading path upstream of the robot unload position. The positioner part 44 does not move past the drying station 90. When the positioner part 44 moves towards the substrate table WT, the positioner part 44 does not reach the drying station 90. By providing that the positioner part 44 does not reach the drying station 90, the drying station 90 is outside of the movement range of the positioner part 44. The drying station 90 does not obstruct movement of the positioner part 44 of the substrate handling robot 41.

In an embodiment the substrate W is moved substantially horizontally by the substrate handling robot 41. In an embodiment the holder 43 is below the substrate W when the substrate W is being transferred. In an embodiment the height of the positioner part 44 in the z-direction is greater than the height of the holder 43 in the z-direction. In an embodiment the top of the positioner part 44 is higher than the surface 46 of the substrate W. In an embodiment the top of the positioner part 44 is higher than the bottom of the drying station 90. If the drying station 90 is in the movement range of the positioner part 44, then the drying station 90 could potentially obstruct movement of the positioner part. By providing that the drying station 90 is located in the substrate unloading path upstream of the robot unload position, the drying station 90 is outside of the movement range of the positioner part 44. The drying station 90 does not obstruct movement of the positioner part 44 of the substrate handling robot 41.

In an embodiment the drying station 90 is located adjacent the robot unload position. By providing that the drying station 90 is located adjacent the robot unload position, the drying station 90 may be as close as possible to the substrate table WT without obstructing movement of the substrate handling robot 41. An embodiment of the invention is expected to achieve removal of liquid from the surface 46 of the substrate W as soon as possible without negatively affecting throughput. It is desirable to get liquid, e.g. water, off the substrate W as soon as possible.

The drying station 90, which may be called a dryer, removes the liquid from the substrate W as soon as possible after unloading of the substrate W from the stage, e.g. substrate table WT, and without affecting the throughput of the machine, i.e. the lithographic apparatus 100. It is desirable for the drying station 90 to be located as close as possible to the position at which the substrate W is unloaded. It is desirable that the movement of the substrate handling robot 41 draws the surface 46 of the substrate W under the fluid flow of the drying station 90. By removing the droplets 50 as soon as possible, the exposure time of the resist to the water droplets is minimized, reducing the risk of a defect occurring. In an embodiment the drying station 90 is in the substrate handler (which may be called a wafer handler).

The form of the drying station 90 can be anything so long as it is feasible. The two types depicted in FIG. 4 and FIG. 5 and described above are examples of simple drying stations 90.

The drying station 90 is associated with the substrate handler because to have it with the substrate table WT, e.g. at or above the substrate table WT would negatively affect throughput. This is because after an exposure process, extra time at the wafer stage would be needed to dry the substrate W. The substrate W is moved more slowly when the substrate W is being dried than otherwise. If the drying station 90 were at the wafer stage (e.g. at the liquid confinement structure IH or at the substrate table WT), then the substrate W would need to be removed from the substrate table WT slowly so as to dry the substrate W.

By providing that the drying station 90 is in the post-exposure handling module 94, the substrate W can be removed more quickly from the substrate table WT. A subsequent substrate W can be loaded onto the substrate table WT for the next exposure process more quickly. An embodiment of the invention is expected to achieve an improvement in throughput of the lithographic apparatus 100.

In an embodiment the post-exposure handling module 94 comprises at least one substrate handler sensor 51. For example, the substrate handler sensor 51 may be a substrate exchange sensor (which may be called a wafer exchange sensor). The at least one substrate handler sensor 51 is configured to measure a parameter associated with the substrate handling robot 41. For example, in an embodiment the at least one substrate handler sensor 51 is configured to measure a tilt of the holder 43 of the substrate handling robot 41 relative to the XY-plane. In an embodiment the at least one substrate handler sensor 51 is located in the substrate unloading path. In an embodiment the at least one substrate handler sensor 51 performs the measurement when the substrate W is being transferred from the substrate table WT after an exposure process.

In an embodiment the drying station 90 is located near the at least one substrate handler sensor 51. In an embodiment the drying station 90 is in/near the substrate exchange sensors. In an embodiment the drying station 90 is located adjacent the at least one substrate handler sensor 51. In an embodiment the at least one substrate handler sensor 51 is attached to the sensor frame SF. The sensor frame SF is located in the substrate unloading path. In an embodiment the drying station 90 is located between the robot unload position and the sensor frame SF. In an embodiment the drying station 90 is fixed to the sensor frame SF. By providing that the drying station 90 is fixed to the sensor frame SF, the space taken by the drying station 90 is minimized.

In an embodiment the drying station 90 is located between the at least one substrate handler sensor 51 and the base frame BF of the lithographic apparatus 100. In an embodiment the base frame BF comprises an air duct. In an embodiment the drying station 90 is located between the air duct and the at least one substrate handler sensor 51.

In an embodiment the drying station 90 has a width that is greater than width of the substrate W. For example, when the width of the substrate W is about 300 mm, the drying station 90 may have a width of greater than about 300 mm, for example 320 mm. When the width of the substrate W is about 450 mm, the drying station 90 may have a width of greater than about 450 mm. The drying station 90 can actively remove liquid from the whole of the surface 46 of the substrate W. The drying station 90 actively removes liquid from the surface 46 of the substrate W when the substrate W passes underneath the drying station 90.

In an embodiment the drying station 90 has a width, a length and a height. In an embodiment the drying station 90 is elongate such that the width is greater than the length or the height. In an embodiment the width is greater than about 300 mm, or greater than about 450 mm. For example, in an embodiment, the width of the drying station 90 is about 320 mm. In an embodiment, the length is less than about 50 mm, for example about 20 mm. In an embodiment the height is less than about 50 mm, for example about 30 mm.

In an embodiment the lithographic apparatus 100 comprises an exposure module 95 that interfaces with the post-exposure handling module 94. The substrate table WT is in the exposure module 95. The liquid confinement structure IH is in the exposure module 95. In an embodiment the drying station 90 is located near or in an interface between the exposure module 95 and the post-exposure handling module 94.

The drying station 90 is not located in the exposure module 95 so that time is not wasted drying the substrate Win the exposure module 95. An embodiment of the invention is expected to achieve increased throughput of substrates W through the exposure module 95.

The drying station 90 is located near the interface between the exposure module 95 and the post-exposure handling module 94 so that the drying station 90 is located as close as possible to the substrate table W. By locating the drying station 90 as close as possible to the substrate table W, the time that the droplets 50 remain on the surface 46 of the substrate W is minimized.

The position of the drying station 90 within the post-exposure handling module 94 may be selected so as to minimize space conflicts with other components of the lithographic apparatus 100. In an embodiment the drying station 90 is spaced from the interface between the exposure module 95 and the post-exposure handling module 94.

In an embodiment the drying station 90 comprises a drying station actuator 45 (depicted in FIG. 6). The drying station actuator 45 is configured to move the drying station 90 up and down with respect to stationary components of the lithographic apparatus 100. For example, in an embodiment the substrate handler sensor 51 is stationary during use of the lithographic apparatus 100. The drying station actuator 45 is configured to move the drying station 90 up and down with respect to the substrate handler sensor 51. In an embodiment the drying station actuator 45 is configured to move the drying station 90 up and down with respect to the substrate W. The drying station actuator 45 is configured to move the drying station 90 between a drying position and a non-drying position. In the drying position the drying station 90 actively removes liquid from the surface 46 of the substrate W.

By providing the drying station actuator 45, the drying station 90 may have a drying position that would interfere with the movement of the substrate handling robot 41 even if the substrate handling robot 41 moves through the drying position. As mentioned above, in an embodiment the positioner part 44 of the substrate handling robot 41 does not reach the drying station 90 such that the drying station 90 is outside of the movement range of the positioner part 44. Hence the drying station 90 does not obstruct movement of the positioner part 44 of the substrate handling robot 41. However, by providing the drying station actuator 45, the drying station 90 does not obstruct movement of the positioner part 44 of the substrate handling robot 41 even if the substrate handling robot 41 reaches the drying station 90 in the X-Y plane. In the non-drying position the drying station 90 does not interfere with the movement of the substrate handling robot 41 because the drying station 90 and the substrate handling robot 41 have different positions in the z-direction. In an embodiment in which the substrate handling robot 41 reaches the drying station 90 in the X-Y plane, the drying station 90 is in the non-drying position when the positioner part 44 of the substrate handling robot 41 passes the drying station 90. After the positioner part 44 has passed the drying station 90, the drying station actuator 45 can move the drying station 90 to the drying position. The drying station 90 is in the drying position when the substrate W passes the drying station 90.

In an embodiment the method of transferring the substrate W comprises moving the drying station 90 up and down (with respect to stationary components of the lithographic apparatus 100) between the drying position in which the drying station 90 actively removes liquid from the surface 46 of the substrate W and a non-drying position.

In an embodiment the substrate handling robot 41 is configured to reduce a speed of the substrate W through the substrate unloading path when the substrate W passes the drying station 90. Although reducing the speed may decrease throughput, a higher proportion of liquid can be removed from the surface 46 of the substrate W. In an embodiment the substrate W is transferred at a reduced speed through the substrate unloading path when the substrate W passes the drying station 90. For example, the substrate handling robot 41 may transfer the substrate W at a speed of about 1 ms$^{-1}$ when the substrate W passes the drying station 90. By reducing the speed, a higher proportion of liquid can be removed from the surface 46 of the substrate W when the substrate W passes the drying station 90.

In the drying position, the distance between the drying station 90 and the substrate W passing underneath is desirably as small as possible. In an embodiment the distance is less than about 10 mm, and preferably less than about 5 mm. In an embodiment the distance is less than about 1 mm, for example about 0.3 mm.

In an embodiment the drying station 90 is located near at least one substrate handler sensor 51. The location of the drying station 90 is within a region in which the substrate handler sensor 51 is positioned. In an embodiment the drying station 90 is connected to a fixed component of the lithographic apparatus 100. For example, in an embodiment the drying station 100 is connected to the base frame BF that is depicted in FIG. 1.

In an embodiment the drying station 90 has a fixed position within the lithographic apparatus 100. In such an embodiment the drying station 90 does not move during use of the lithographic apparatus 100 or during use of the drying station 90. In use of the lithographic apparatus 100, the substrate handling robot 41 transfers the substrate W from the substrate table WT under the drying station 90 such that the drying station 90 actively removes liquid from the surface of the substrate W. The drying station 90 has an aerostatic bearing to create a defined distance between the substrate W and the drying station 90. Liquid is actively removed from the surface of the substrate W as the substrate W moves under the drying station 90.

In an embodiment the drying station 90 is in the region in which a substrate sensor is located and the drying station 90 is actuated in the vertical direction by a drying station actuator 45. The drying station actuator 45 is described above in relation to FIG. 6. The substrate sensor is configured to measure a parameter (e.g. height) associated with the substrate W. The substrate handler sensor 51 may be used as the substrate sensor. Alternatively, the substrate sensor can be a separate sensor from the substrate handler sensor 51. The substrate sensor is positioned between the substrate table WT and the drying station 90. After the substrate W is unloaded from the substrate table WT, the substrate W passes the substrate sensor before the substrate W passes the drying station 90. In an embodiment the substrate sensor is configured to measure the height of the substrate W. In an embodiment the drying station 90 is actuated by the drying station actuator 45 based on the height measurement made by the substrate sensor. In an embodiment the drying station actuator 45 is controlled based on the height measurement made by the substrate sensor. The drying station 90 has an aerostatic bearing to create a defined distance between the substrate W and the drying station 90. Although the drying station 90 is actuated in the vertical direction, the drying station 90 is stationary in the horizontal direction. The liquid is actively removed from the substrate W as the substrate W moves below the drying station 90.

Figure 14:
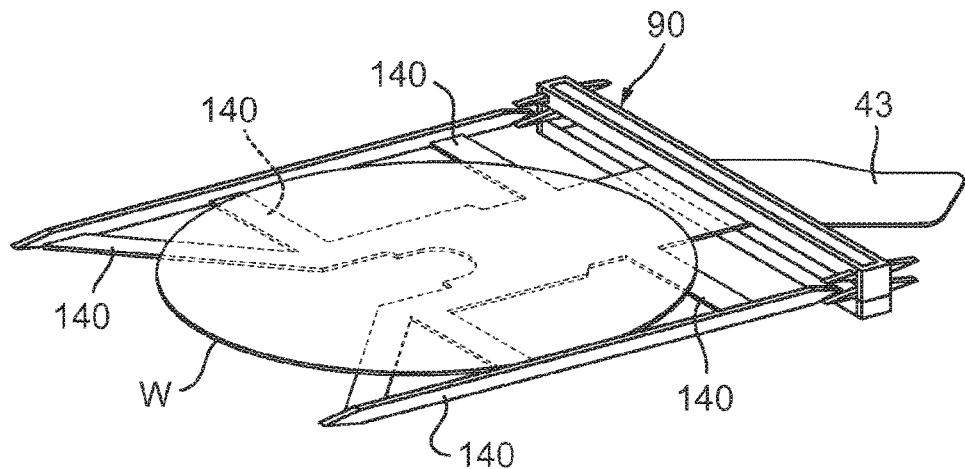

In an embodiment the holder 43 of the substrate handling robot 41 has a shape for increasing flatness of the substrate W. The holder 43 provides mechanical support against unflatness of the substrate W. For example, in an embodiment the holder 43 comprises a network of struts 140 that extend in the horizontal direction so as to provide mechanical support for the substrate more extensively in the plane of the substrate W. The struts are shown in FIG. 14.

Figure 7:
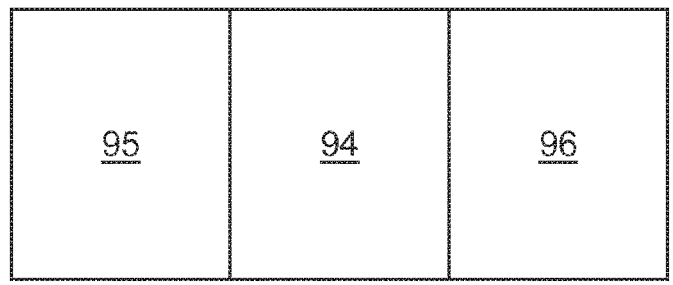

FIG. 7 schematically depicts a lithographic apparatus 100 according to an embodiment. As shown in FIG. 7, in an embodiment the lithographic apparatus 100 comprises a post immersion rinse module 96. The post immersion rinse module 96 interfaces with the post-exposure handling module 94. The post immersion rinse module 96 comprises a post immersion rinse station (not shown). In the post immersion rinse module 96, for example at the post immersion rinse station, undesirable water marks may be removed from the surface of the substrate W. The undesirable water marks can damage the structures printed on the substrate W. Therefore, the water marks can undesirably affect the product yield. The undesirable water marks can be caused by liquids such as the immersion liquid remaining on the surface of the substrate W after an exposure process.

Figure 8:
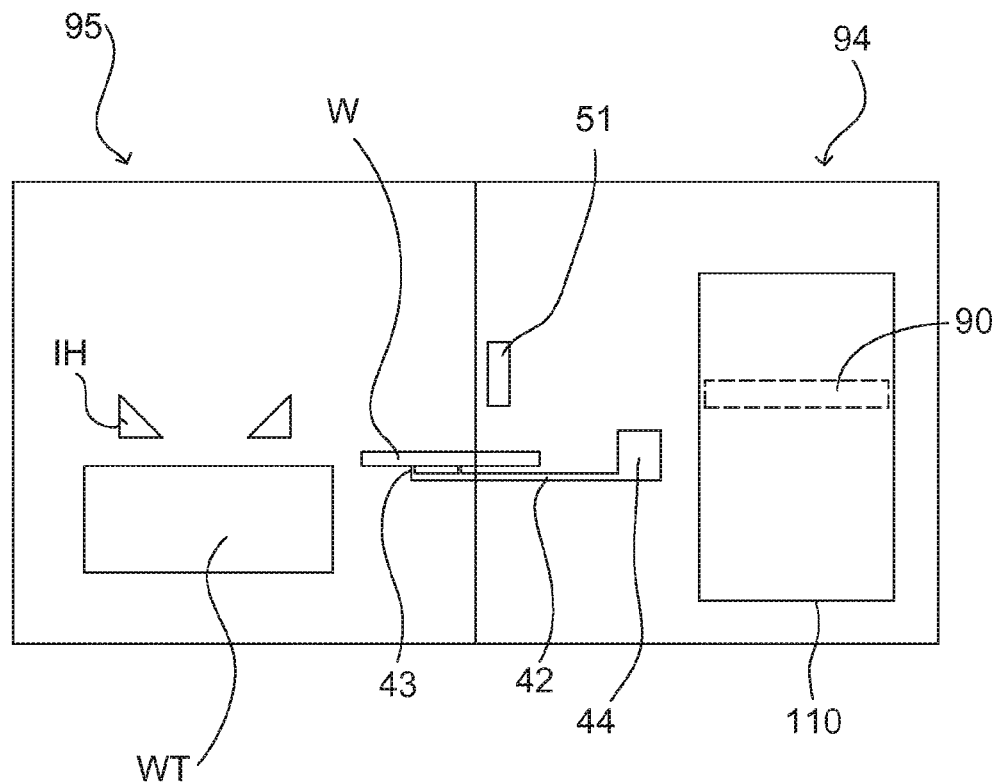

FIG. 8 depicts a lithographic apparatus 100 according to an embodiment. As depicted in FIG. 8, in an embodiment the post-exposure handling module 94 comprises a storage unit 110. The storage unit 110 is configured to store a plurality of substrates W. The storage unit 110 comprises a plurality of substrate accommodation units. Substrates W can be stored in respective substrate accommodation units of the storage unit 110.

FIG. 9 schematically depicts a storage unit 110 of a lithographic apparatus 100 according to an embodiment. As depicted in FIG. 9, in an embodiment the storage unit 110 comprises an upper closing substrate accommodation unit 111 as one of the substrate accommodation units. The upper closing substrate accommodation unit 111 is configured to store or accommodate a closing substrate. In an embodiment the storage unit 110 comprises a lower closing substrate accommodation unit 112 as one of the substrate accommodation units. The lower closing substrate accommodation unit 112 is configured to store or accommodate a closing substrate. In an embodiment the storage unit 110 comprises zero, one or more than two substrate accommodation units for storing closing substrates.

A closing substrate may be used to stabilize the temperature of part of the lithographic apparatus 100 during periods of time between exposure processes of different substrates W. For example, one batch of substrates W may be exposed in exposure processes. Before a subsequent batch of substrates W is exposed, a closing substrate may be positioned on the substrate table WT for temperature stabilization. For example, the closing substrate may help to stabilize the temperature of the substrate table WT. In an embodiment a substrate W may be loaded into the bottom accommodation unit 114 from the post immersion rinse module 96.

As depicted in FIG. 9, in an embodiment the storage unit 110 comprises a discharge unit 113 as one of the substrate accommodation units. The discharge unit 113 is configured to accommodate a substrate W after the substrate W has been exposed in an exposure process. In an embodiment the substrate handling robot 41 is configured to transport an exposed substrate W from the substrate table WT to the discharge unit 113. In an embodiment the exposed substrate W is subsequently transported from the discharge unit 113 to the post immersion rinse module 96.

As depicted in FIG. 9, in an embodiment the storage unit 110 comprises a bottom accommodation unit 114 as one of the substrate accommodation units. In an embodiment the bottom accommodation unit 114 is configured to store or accommodate a substrate W.

As depicted in the FIG. 10, in an embodiment the drying station 90 is located in the storage unit 110. In an embodiment the drying station 90 is located in the region of the discharge unit 113. The drying station 90 may be located in other parts of the storage unit 110. For example, the drying station 90 may be located in the bottom accommodation unit 114. Alternatively, the drying station 90 may be located at or near the entry/exit point for the discharge unit 113 of the storage unit 110.

FIGS. 9 and 10 show a particular arrangement of substrate accommodation units. However, the storage unit 110 comes in different arrangements of substrate accommodation units. For example, in an embodiment the discharge unit 113 may be arranged to be at the top of the storage unit 110. Accordingly, the drying station 90 may be positioned at the top of the storage unit 110.

FIG. 11 schematically depicts a plan view of part of a lithographic apparatus 100 according to an embodiment. FIG. 11 depicts a substrate W undergoing a drying process. As depicted in FIG. 11, in an embodiment the drying station 90 is elongate and takes the form of a drying station arm. The drying station 90 is configured to actively remove liquid from the surface of the substrate W. For example, the drying station 90 may comprise a gas knife 91 or a continuous flow of liquid.

As depicted in FIG. 11, in an embodiment the drying station 90 in the form of the drying station arm is configured to rotate around a pivot point 97. In an embodiment the drying station 90 comprises a rotator (not shown) configured to rotate the drying station 90 in the form of the drying station arm through a rotation plane parallel to the surface of the substrate W. When the drying station 90 is not in use, the drying station 90 may be rotated such that it is retracted to a position in which it is not located above any substrate W in the discharge unit 113. When the drying station 90 is to be used, the drying station 90 in the form of the drying station arm is rotated around the pivot point 97.

For example, in an embodiment the rotation of the drying station 90 is controlled such that part of drying station 90 is located above the middle or center point of the substrate W. When the drying station 90 is not needed, the drying station 90 can be retracted so that it does not get in the way of other components such as the substrate W when the substrate W is being transferred into the discharge unit 113. Subsequently, when the substrate W is in position in the discharge unit 113, the drying station 90 is rotated into a location where the drying station 90 can actively remove liquid from the surface of the substrate W.

As depicted in FIG. 11, in an embodiment the discharge unit 113 comprises a substrate turntable 120. The substrate turntable 120 is configured to rotate the substrate W. The substrate W moves relative to the drying station 90 by the rotation of the drying station 90, by the rotation of the substrate W or by a combination of the rotation of the drying station 90 and the rotation of the substrate W.

As depicted in FIG. 11, in an embodiment the drying station 90 in the form of the drying station arm extends over a radius of the substrate turntable 120. The drying station 90 does not extend across the full diameter of the substrate W in use. Instead the drying station 90 has a length just greater than the radius of the substrate W. The drying station 90 can actively remove liquid from the surface of the substrate W when the substrate W is rotated on the substrate turntable 120.

In an embodiment the drying station 90 moves integrally with a substrate support part that supports the substrate W. For example, the drying station arm shown in FIG. 11 may be formed integrally with a substrate support part. In such an embodiment, the substrate support part may form part of the substrate turntable 120. The parts of the substrate turntable 120 depicted in FIG. 11 form a rotation device for gripping and rotating the substrate W.

Alternatively, the substrate W may be supported by a plate and/or supporting poles below the substrate W. In such an embodiment, the plate and/or the supporting poles may form part of the substrate turntable 120. Such an embodiment is expected to achieve a less complex drying station 90 than the drying station described in the paragraph above because the drying station 90 is independent of the plate and supporting poles that support the substrate W.

In an embodiment, the drying station 90 does not rotate in the plane parallel to the substrate W. In an embodiment the drying station 90 is fixed in position during use of the lithographic apparatus 100. In such an embodiment, the pivot point 97 may not be provided. In such an embodiment the liquid is removed from the surface of the substrate W by rotation of the substrate W below the drying station 90. Such an embodiment is expected to achieve a simpler construction for the drying station 90 because the drying station 90 is not required to rotate.

Figure 12:
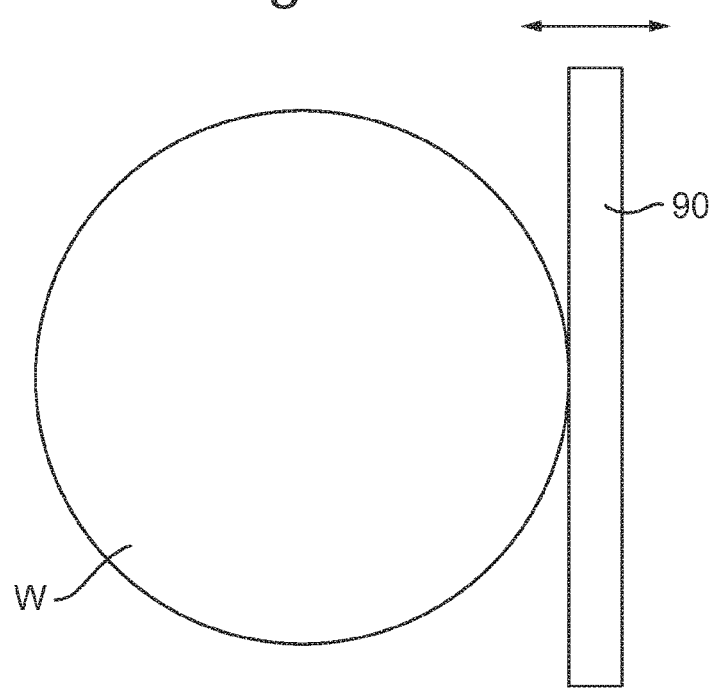

FIG. 12 depicts part of a lithographic apparatus 100 according to an embodiment. As depicted in FIG. 12, in an embodiment the discharge unit 113 is not provided with a substrate turntable 120. Instead, within the discharge unit 113, the substrate W may be substantially stationary. Instead of rotating the substrate W, the drying station 90 is configured to move over the substrate W. The drying station 90 is configured to translate horizontally above the substrate W. As the drying station 90 moves across and above the substrate W, liquid is actively removed from the surface of the substrate W.

In FIG. 12, the double ended arrow shows the direction in which the drying station 90 is configured to move. The direction is not particularly limited. The direction of movement is horizontal. As an example, in an embodiment the direction of movement of the drying station 90 is horizontal and perpendicular to the horizontal direction in which the substrate W enters the discharge unit 113. In an alternative embodiment the direction of movement of the drying station 90 is horizontal and parallel to the horizontal direction in which the substrate W enters the discharge unit 113.

FIG. 13 schematically depicts part of a lithographic apparatus 100 according to an embodiment. As depicted in FIG. 13, in an embodiment the drying station 90 takes the form of the drying station arm that can rotate about pivot point 97. As depicted in FIG. 13, in an embodiment the drying station 90 is elongate such that it is longer than the diameter of the substrate W. Such an embodiment is expected to achieve a simpler construction for the storage unit 110. In particular it is not necessary for the discharge unit 113 (or other units that accommodates the drying station 90) to have a substrate turntable 120.

In the construction depicted in FIG. 13, the substrate W may be substantially stationary within the discharge unit 113. When the drying station 90 is to be used, the drying station 90 can be rotated over the full surface of the substrate W. For example, in an embodiment the drying station 90 may be rotated around the pivot point 97 over an arc that subtends at least 90°.

Figure 15:
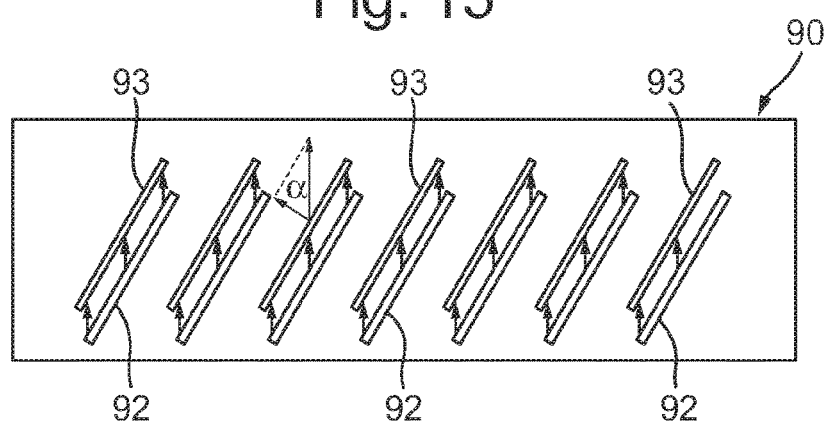
FIGS. 15 and 16 each depicts a drying station according to an embodiment of the invention.
Figure 16:
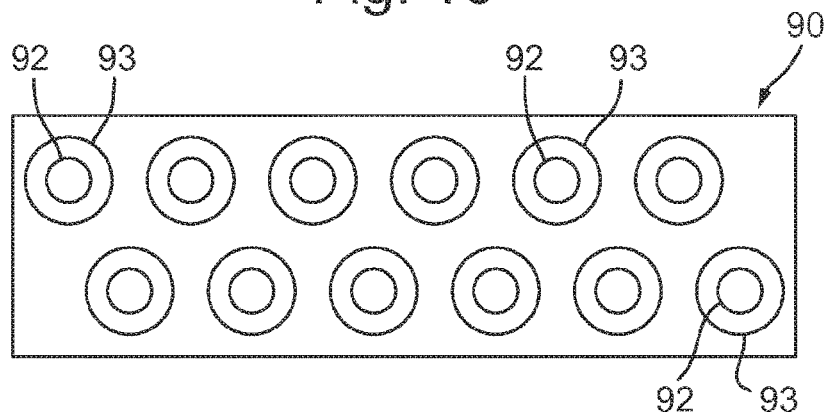

Each of FIGS. 15 and 16 depicts a drying station 90 according to an embodiment of the invention. The features of the drying station 90 shown in FIGS. 15 and 16 can be applied to any embodiment described above in which the drying station 90 comprises a flow supply opening 92 and a flow extraction opening 93.

As depicted in FIG. 15, in an embodiment the drying station 90 comprises a plurality of flow supply openings 92. The flow supply openings 92 are elongate, having a slit-shape. The direction of elongation of the flow supply openings 92 is at an oblique angle relative to the width and length directions of the drying station 90. The small arrows shown in FIG. 15 represent the direction of flow from the flow supply openings 92 to the flow extraction openings 93.

As shown in FIG. 15, the flow supply openings 92 may form an acute angle a with respect to the length direction of the drying station. Accordingly, a direction normal to the direction of elongation of the flow supply openings 92 makes the angle a relative to the length direction of the drying station 90. In an embodiment the acute angle a is in the range of from about 40° to about 80°.

As depicted in FIG. 15, in an embodiment the drying station 90 comprises a plurality of flow extraction openings 93. The flow extraction openings 93 are elongate, having a slit-shape. In an embodiment, the shape of the flow extraction openings 93 is substantially the same as the shape of the flow supply openings 92. As depicted in FIG. 15, in an embodiment the flow extraction openings 93 make an oblique angle relative to the length and width directions of the drying station 90.

As depicted in FIG. 15, in an embodiment the flow supply openings 92 are substantially parallel to each other. In an embodiment the flow extraction openings 93 are substantially parallel to each other. In an embodiment the flow supply openings 92 are substantially parallel to the flow extraction openings 93. An embodiment of the invention is expected to achieve a decrease in the time required for the drying station 90 to scan relative to the surface 46 of the substrate W.

In an embodiment the widths of the flow supply openings 92 overlap each other. This means that when looking at the drying station 90 in the length direction (which is the short side of the drying station shown in FIG. 15), the flow supply openings 92 appear to overlap each other. In an embodiment the flow extraction openings 93 similarly overlap each other in the width direction of the drying station 90. The width direction is the longer side direction shown in FIG. 15. In an embodiment the drying station 90 is arranged such that when the drying station 90 moves relative to the surface 46 of the substrate W in a straight line movement (in the length direction of the drying station 90) the full width of the surface 46 of the substrate W is exposed to the flow supply openings 92 and the flow extraction openings 93.

In an embodiment the flow supply opening 92 is spaced by a distance of less than 20 mm from a corresponding flow extraction opening 93. In an embodiment the space between the flow supply opening 92 and a corresponding flow extraction opening 93 is less than about 5 mm, and optionally more than about 2 mm. An embodiment of the invention is expected to achieve a decrease in the time required for the drying station 90 to scan relative to the surface 46 of the substrate W. The substrate W can pass under the drying station 90 at higher speed while achieving an acceptable drying performance. Each flow supply opening 92 can be relatively small while achieving the effect that the full width of the surface 46 of the substrate W is exposed to the flow supply openings 92.

FIG. 16 depicts an alternative geometrical variation for the flow supply openings 92 and the flow extraction openings 93 of the drying station 90. As depicted in FIG. 16, in an embodiment the drying station 90 comprises a plurality of flow supply openings 92. Each flow supply opening 92 comprises a substantially circular opening. In an embodiment, the drying station 90 comprises a plurality of flow extraction openings 93, each of which forms a ring around a corresponding flow supply opening 92. For example, in an embodiment each flow extraction opening 93 has an annular shape surrounding a flow supply opening 92. An embodiment of the invention is expected to achieve a sufficient drying performance while reducing the possibility of fluid supplied by the flow supply openings 92 reaching unintended sections of the lithographic apparatus 100.

Alternatively, in an embodiment the flow extraction openings 93 form the smaller circular opening for the flow supply opening 92 to surround a corresponding flow extraction opening 93. In an embodiment the flow supply openings 92 are outside of the corresponding flow extraction openings 93.

As depicted in FIG. 16, in an embodiment a flow supply opening 92 and a corresponding flow extraction opening 93 forms a pair. In an embodiment the pairs are arranged to form a line. As depicted in FIG. 16, in an embodiment the pairs of flow supply openings 92 and flow extraction openings 93 are arranged to form staggered rows or lines. In an embodiment the flow extraction openings or flow supply openings 92 are arranged so as to overlap each other in the width direction. When the drying station 90 moves relative to the substrate W, the full width of the surface 46 of the substrate W passes below a flow supply opening 92 and/or a flow extraction opening 93.

In an embodiment the flow supply opening 92 is spaced by a distance of less than 20 mm from a corresponding flow extraction opening 93. In an embodiment the space between the flow supply opening 92 and a corresponding flow extraction opening 93 is less than about 5 mm, and optionally more than about 2 mm.

Unless otherwise stated, the embodiments of the invention described above are compatible with the drying station 90 using either gas or liquid to perform the active removal of liquid from the surface of the substrate. For example, in the construction depicted in FIG. 4, the gas knife 91 may be modified such that a flow of liquid (instead of gas) is provided. In such an embodiment, the liquid is recovered by a liquid recovery system.

The construction depicted in FIG. 5 may be modified such that the flow supply opening 92 and the flow extraction opening 93 provide for a flow of gas (instead of liquid) between them. Regardless of the location of the drying station 90, gas or liquid may be used to perform the active removal of liquid from the surface of the substrate W.

In an embodiment, a device is manufactured by a device manufacturing method comprising using the lithographic apparatus 100 as described above. The lithographic apparatus 100 transfers a pattern from the patterning device MA to the substrate W. In an embodiment, the device manufacturing method comprises the method of transferring the substrate W as described above.

In an embodiment, there is provided a lithographic apparatus comprising: a substrate table configured to support a substrate for an exposure process in which the substrate is exposed to a radiation beam to form a pattern via a liquid; a post-exposure handling module for handling the substrate post-exposure, the post-exposure handling module comprising a storage unit configured to store a plurality of substrates in respective substrate accommodation units of the storage unit; a substrate handling robot configured to transfer the substrate from the substrate table along a substrate unloading path into the post-exposure handling module; and a drying station configured to actively remove liquid from a surface of the substrate; wherein the drying station is located in the storage unit.

In an embodiment, the post-exposure handling module is a substrate handler. In an embodiment, the substrate handling robot comprises a positioner part and a holder that interfaces with the positioner part, wherein the holder is configured to hold the substrate, wherein the positioner part is configured to move between a robot unload position in which the holder holds the substrate on the substrate table and a robot handling position in which the holder holds the substrate in the post-exposure handling module. In an embodiment, the post-exposure handling module comprises at least one substrate handler sensor configured to measure a parameter associated with the substrate handling robot, wherein the at least one substrate handler sensor is located in the substrate unloading path. In an embodiment, the drying station has a form of a drying station arm configured to actively remove liquid from the surface of the substrate, and a rotator configured to rotate the drying station arm through a rotation plane parallel to the surface of the substrate. In an embodiment, the lithographic apparatus further comprises a substrate turntable configured to rotate the substrate, wherein the drying station has a form of a drying station arm that extends over a radius of the substrate turntable such that the drying station arm is configured to actively remove liquid from the surface of the substrate when the substrate is rotated on the substrate turntable. In an embodiment, the drying station is located near a substrate unload position where the substrate is unloaded from the substrate table. In an embodiment, the drying station comprises a drying station actuator configured to move the drying station up and down with respect to the substrate between a drying position in which the drying station actively removes liquid from the surface of the substrate and a non-drying position. In an embodiment, the drying station comprises one or more of a gas knife, a water bath and a continuous flow of liquid.

In an embodiment, there is provided a method of transferring a substrate in a lithographic apparatus, the method comprising: supporting a substrate for an exposure process in which the substrate is exposed to a radiation beam to form a pattern via a liquid; transferring the substrate along a substrate unloading path into a post-exposure handling module for handling the substrate post-exposure, the post-exposure handling module comprising a storage unit configured to store a plurality of substrates in respective substrate accommodation units of the storage unit; and actively removing liquid from a surface of the substrate, wherein the active removal of liquid is performed in the storage unit.

In an embodiment, the post-exposure handling module comprises at least one substrate handler sensor configured to measure a parameter associated with the substrate handling robot, wherein the at least one substrate handler sensor is located in the substrate unloading path. In an embodiment, the method further comprises rotating a drying station arm through a rotation plane parallel to the surface of the substrate so as to actively remove liquid from the surface of the substrate. In an embodiment, the method comprises rotating the substrate, wherein the active removal of liquid is performed by a drying station arm that extends over a radius of the substrate turntable such that the drying station arm actively removes liquid from the surface of the substrate when the substrate is rotated. In an embodiment, the method further comprises moving a drying station that performs the active removal of liquid up and down with respect to the substrate between a drying position in which the drying station actively removes liquid from the surface of the substrate and a non-drying position. In an embodiment, the active removal of liquid is performed using one or more of a gas knife, a water bath and a continuous flow of liquid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. An apparatus comprising:
 a post-exposure handling module configured to handle a substrate post-exposure, the post-exposure handling module comprising a storage unit configured to store a substrate; and
 a drying station configured to actively remove remaining liquid from a surface of the substrate, wherein the drying station comprises:
  an elongate structure comprising a liquid supply opening and a liquid extraction opening, the elongate structure, liquid supply opening and liquid extraction opening configured to confine liquid from the liquid supply opening to a localized region on the substrate, the localized region having an area smaller than the substrate,
  an actuator system configured to provide relative movement between the structure and the substrate in the storage unit,
  wherein the drying station is configured to control the supply of liquid from the liquid supply opening and extraction of liquid from the liquid extraction opening so as to right away extract essentially all of the supplied liquid so as to form the localized region of liquid for relative movement between the substrate and the localized region during relative movement between the structure and the substrate in the storage unit caused by the actuator system.

2. The apparatus of claim 1, wherein the actuator system is further configured to move the structure up and down with respect to the substrate between a drying position in which the drying station actively removes liquid from the surface of the substrate and a non-drying position.

3. The apparatus of claim 1, wherein the storage unit is configured to store each substrate of a plurality of substrates in respective stacked substrate accommodation units of the storage unit; and
 the drying station is located in or above one of the substrate accommodation units of the storage unit and at least one other substrate accommodation unit of the substrate accommodation units is absent a drying apparatus.

4. The apparatus of claim 3, wherein at least two other substrate accommodation units of the substrate accommodation units are absent a drying apparatus.

5. The apparatus of claim 1, further comprising a substrate handling robot configured to transfer the substrate along a substrate unloading path to the drying station.

6. The apparatus of claim 5, wherein the substrate handling robot comprises a positioner part and a holder that interfaces with the positioner part, wherein the holder is configured to hold the substrate, wherein the positioner part is configured to move between a robot unload position in which the holder holds the substrate on or over a substrate table arranged to hold a substrate for exposure by a projection system configured to project radiation onto the substrate and a robot handling position in which the holder holds the substrate at the drying station.

7. The apparatus of claim 5, further comprising at least one substrate handler sensor configured to measure a parameter associated with the substrate handling robot, wherein the at least one substrate handler sensor is located in a substrate unloading path.

8. A lithographic apparatus comprising:
a substrate table configured to support a substrate;
a projection system configured to project a radiation beam onto the substrate;
a liquid handing system configured to provide a liquid to a space between the substrate table and the projection system for an exposure process in which the substrate is exposed, via the liquid, to a radiation beam to form a pattern; and
the post-exposure handling module of claim 1.

9. The lithographic apparatus of claim 8, wherein a common housing is configured to contain therein at least the substrate table, the liquid handling system, the storage unit, and the drying station.

10. An apparatus comprising:
a post-exposure handling module configured to handle a substrate post-exposure, the post-exposure handling module comprising a storage unit configured to store each substrate of a plurality of substrates in respective stacked substrate accommodation units of the storage unit; and
a drying station configured to actively remove remaining liquid from a surface of the substrate, wherein the drying station is located above a support surface of a first substrate accommodation unit of the substrate accommodation units and at least a second accommodation unit of the substrate accommodation units, that is located underneath the first accommodation unit is, absent a drying apparatus.

11. The apparatus of claim 10, further comprising:
an elongate structure comprising a liquid supply opening and a liquid extraction opening,
an actuator system configured to provide relative movement between the structure and the substrate in the storage unit, and
a control system configured to control the supply of liquid from the liquid supply opening and extraction of liquid from the liquid extraction opening so as to right away extract essentially all of the supplied liquid so as to form a localized region of liquid scanning across the substrate during relative movement between the structure and the substrate in the storage unit caused by the actuator system.

12. The apparatus of claim 11, further comprising an actuator system configured to move the structure up and down with respect to the substrate between a drying position in which the drying station actively removes liquid from the surface of the substrate and a non-drying position.

13. The apparatus of claim 10, wherein at least one further substrate accommodation unit of the substrate accommodation units is absent a drying apparatus.

14. The apparatus of claim 10, further comprising a substrate handling robot configured to transfer the substrate along a substrate unloading path to the drying station.

15. The apparatus of claim 14, wherein the substrate handling robot comprises a positioner part and a holder that interfaces with the positioner part, wherein the holder is configured to hold the substrate, wherein the positioner part is configured to move between a robot unload position in which the holder holds the substrate on or over a substrate table arranged to hold a substrate for exposure by a projection system configured to project radiation onto the substrate and a robot handling position in which the holder holds the substrate at the drying station.

16. The apparatus of claim 14, further comprising at least one substrate handler sensor configured to measure a parameter associated with the substrate handling robot, wherein the at least one substrate handler sensor is located in a substrate unloading path.

17. A lithographic apparatus comprising:
a substrate table configured to support a substrate;
a projection system configured to project a radiation beam onto the substrate;
a liquid handing system configured to provide a liquid to a space between the substrate table and the projection system for an exposure process in which the substrate is exposed, via the liquid, to a radiation beam to form a pattern; and
the apparatus of claim 10.

18. The lithographic apparatus of claim 17, wherein a common housing is configured to contain therein at least the substrate table, the liquid handling system, the storage unit, and the drying station.

19. A method comprising:
transferring a substrate having remaining liquid thereon, along a substrate unloading path to a storage unit configured to store the substrate;
providing relative movement between an elongate structure comprising a liquid supply opening and a liquid extraction opening and the substrate in the storage unit, the elongate structure, liquid supply opening and liquid extraction opening confining liquid from the liquid supply opening to a localized region on the substrate, the localized region having an area smaller than the substrate; and
actively removing the remaining liquid from the substrate by supplying liquid from the liquid supply opening and extracting liquid through the liquid extraction opening so as to right away extract essentially all of the supplied liquid so as to form the localized region of liquid for relative movement between the substrate and the localized region during the relative movement between the structure and the substrate in the storage unit.

20. The method of claim 19, wherein the structure is located above a support surface of a first substrate accommodation unit of a plurality of substrate accommodation units of the storage unit and at least a second accommodation unit of the substrate accommodation units, that is located underneath the first accommodation unit is absent a drying apparatus.

* * * * *